United States Patent
Herberholz et al.

(10) Patent No.: US 10,715,148 B1
(45) Date of Patent: Jul. 14, 2020

(54) TRANSIENT SENSING CIRCUITRY

(71) Applicant: Arm Limited, Cambridge (GB)

(72) Inventors: Rainer Herberholz, Great Abington (GB); Amit Chhabra, Noida (IN); Yannis Jallamion-Grive, Mouans Sartoux (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/512,120

(22) Filed: Jul. 15, 2019

(51) Int. Cl.
*H03K 19/173* (2006.01)
*H03K 19/0175* (2006.01)

(52) U.S. Cl.
CPC . *H03K 19/1733* (2013.01); *H03K 19/017581* (2013.01); *H03K 19/017509* (2013.01); *H03K 19/017545* (2013.01)

(58) Field of Classification Search
CPC ....... H03K 19/1733; H03K 19/017581; H03K 19/017545; H03K 19/017509
See application file for complete search history.

(56) References Cited

U.S. PATENT DOCUMENTS

| | | | | |
|---|---|---|---|---|
| 10,128,755 | B2* | 11/2018 | Paul | H02M 3/1584 |
| 2013/0154685 | A1* | 6/2013 | Noyes | H03K 19/20 |
| | | | | 326/38 |
| 2014/0210266 | A1* | 7/2014 | Tournatory | H02M 3/158 |
| | | | | 307/31 |
| 2018/0013347 | A1* | 1/2018 | Paul | H02M 3/1584 |

\* cited by examiner

*Primary Examiner* — Daniel D Chang
(74) *Attorney, Agent, or Firm* — Pramudji Law Group PLLC; Ari Pramudji

(57) ABSTRACT

Various implementations described herein are directed to an integrated circuit with logic circuitry having one or more components. The integrated circuit may include performance sensing circuitry that provides a performance sensing output associated with detecting variation of switching delays of the one or more components forming the logic circuitry. The integrated circuit may include transient sensing circuitry that receives the performance sensing output and provides a transient sensing output for determining stability of operating conditions of the performance sensing circuitry during one or more sampling periods. The transient sensing circuitry may use a finite state machine (FSM) to sense and classify changes in temporal behavior of the transient sensing output.

20 Claims, 8 Drawing Sheets

TRANSIENT SENSING CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated digital circuits may use sensors built into a design to determine timing margins during operation. These sensors may provide feedback to a control loop to deliver reliable operation, and typically, a multitude of sensor readings may be taken to represent a circuit adequately. In this instance, each sensor reading averages impact of instantaneous operating conditions, such as, e.g., voltage and temperature, over a period of time. Transient fluctuations of the operating conditions during acquisition of a single sensor reading, or across successive acquisition of readings from multiple sensors, can skew overall results. If impact of such fluctuations remain undetected, they may lead to instability of a feedback loop that is intended to improve circuit operation.

BRIEF DESCRIPTION OF THE DRAWINGS

Implementations of various schemes and techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to various schemes and techniques for providing transient sensing circuitry to ensure fidelity of delay monitoring in digital circuits. For instance, various schemes and techniques described herein provide for a finite state machine (FSM) methodology for classifying temporal behavior and characteristics of transient signals associated with logic and memory circuitry. The scheme refers to methods for closed-loop adaptive voltage scaling (AVS) whereby the closed loop is characterised by its loop bandwidth. Thus, the various schemes and techniques described herein may provide for transient sensor circuitry that ensures fidelity of measurements of the average sensor frequency over a measurement window. If undetected, delay measurements impacted by transient events may cause the AVS loop to become unstable. The transient sensor circuitry may sense transient overshoot and/or undershoots as well as ramps that occur in a measurement window. The transient sensor may provide an output that states whether voltage and temperature was at least one of stable, rising, falling, or unstable during measurements so as not to interfere with the AVS control loop.

In some instances, performance of logic and memory circuitry may be based on one or more operating conditions associated with detected variation of at least one of voltage and temperature of the logic/memory circuitry. In other instances, the performance of the memory circuitry may be adjusted using adaptive voltage scaling (AVS).

Various implementations of providing transient sensing schemes and techniques will now be described in greater detail herein with reference to FIGS. 1-7.

Figure 1:
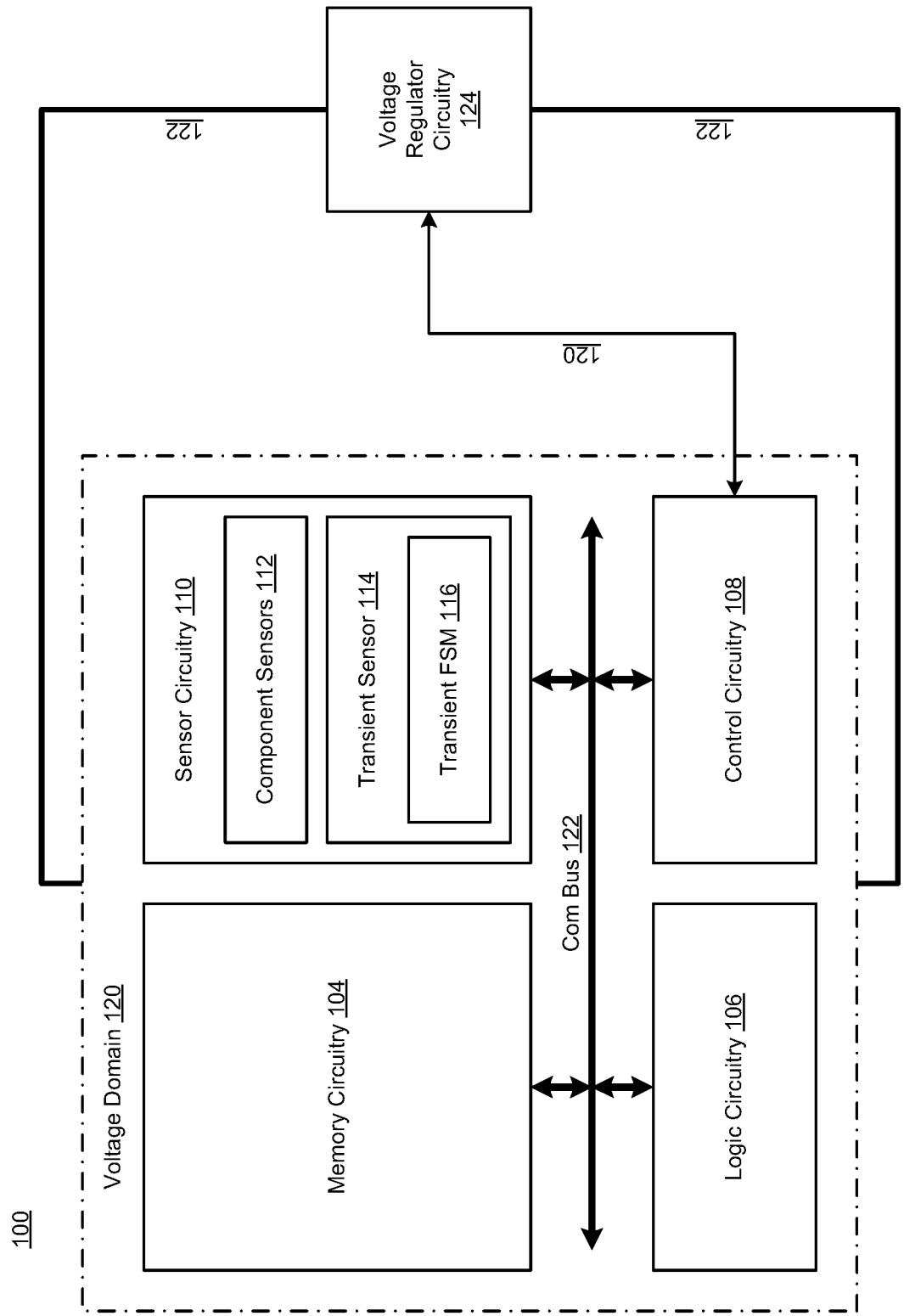
FIG. 1 illustrates a schematic diagram of circuitry having memory circuitry along with transient sensing circuitry in accordance with implementations described herein.

FIG. 1 illustrates a schematic diagram of circuitry 100 having memory circuitry 104, logic circuitry 106 and some type of control circuitry 108, along with transient sensing circuitry 114 in accordance with implementations described herein. In various implementations, the circuitry 100 may operate in reference to a particular voltage domain 120 that is associated with an input voltage supply (Vdd). In some instances, the voltage domain 120 may be an AVS-enabled voltage domain.

As shown in FIG. 1, the circuitry 100 includes the memory circuitry 104 having a memory structure with an array of bitcells (e.g., memory cells and related logic circuitry). As described herein, performance of the memory structure is based on one or more operating conditions and temporal behaviors associated with a detected variation of voltage and/or temperature of the memory structure. Also, the memory circuitry 100 may be coupled to the transient sensing circuitry 114 (or transient sensor) that uses a transient finite state machine (FSM) 116, and the memory circuitry 104 may include self-timed memory circuitry having adaptive voltage scaling (AVS) capability and/or characteristics.

The circuitry 100 may include sensor circuitry 110 having one or more component sensors 112 and the transient sensor 114 with the transient FSM 116. In some instances, the one or more component sensors 112 may be implemented as one type of performance sensing circuitry having a logic structure that is adapted to detect variation of performance of any one amongst the memory structure (i.e., bitcells in the array), logic NMOS devices, logic PMOS devices, parasitic resistance, parasitic capacitance, or any combination thereof. The logic circuitry may provide an output signal to power management circuitry (e.g., voltage regulator circuitry 124) based on the detected performance variation of the component sensors. Alternatively, in some implementations, the dedicated control circuitry 108 may be used for this purpose which may be located wither within the AVS-enabled voltage domain, or in a separate voltage domain.

The transient sensor 114 includes performance sensing circuitry that is adapted to reveal fluctuations in Voltage and Temperature within a single measurement window of the component sensors of any one amongst the memory structure, logic NMOS devices, logic PMOS devices, parasitic resistance, parasitic capacitance, or any combination thereof. The stability of the output of components sensors refers to a transient overshoot, undershoot or continuous rise or fall of their internal oscillating frequency during a sampling period. As will be described in greater detail herein, the transient sensor 114 is adapted to provide a transient detection that may be used to identify whether the temporal behavior of the component sensors is at least one of stable or unstable, rising or falling.

The transient FSM 116 may be used to receive the output of the transient sensor 114 and then qualify the output of the component sensors for processing by the logic circuitry 106 or control circuitry 108. The transient FSM 116 may be used to classify changes in the temporal behavior of the waveform. As described in greater detail herein in reference to FIG. 6, the transient FSM 116 may sense changes that refer to sensing a level of change, such as, e.g., a weak level of change and a strong level of change, and the transient FSM 116 may move the states of stability from one state to another different state based on sensing the level of change. Also, the transient FSM 116 may sense changes that refer to sensing a direction of change, such as, e.g., rising (or increasing) direction of change and falling (or decreasing) direction of change, and the transient FSM 116 may move the states of stability from one state to another different state based on sensing the direction of change. Also, the transient FSM 116 may be adapted to provide its state at the end of a measurement window to a sensor controller based on sensing changes in the temporal behavior of the waveform.

The circuitry 100 may include the control circuitry 108 that is coupled to the sensor circuitry 110, the memory circuitry 104, the logic circuitry 106 and the voltage regulator circuitry 124. In some cases, the control circuitry 108 may receive various control signals from the sensor circuitry 110 and use adaptive voltage scaling (AVS) to adaptively adjust voltage (Vdd) that is provided to the memory circuitry 104 and the logic circuitry 106 based on the control signal. This will affect the performance of the memory circuitry 104 and the logic circuitry 106. Also, the control circuitry 108 may be coupled to the voltage regulator circuitry 124 so as to thereby provide an AVS interface to adaptively adjust voltage (Vdd) that is provided to the circuitry in 120.

The circuitry 100 may include the voltage regulator circuitry 124, which is coupled to the control circuitry 108 either via direct control signals or interface over the communication bus 122. The circuitry 100 may include a communication bus 122 that may be utilized to interface to all system components. In some implementations, the circuitry 100 may be fabricated and implemented as an integrated circuit (IC), and thus, the circuitry 100 may be integrated with various types of computing circuitry and related components on a single chip. Also, the circuitry 100 may be implemented in many embedded systems for various types of electronic, mobile, Internet-of-Things (IoT) and/or biometric applications.

Figure 2:
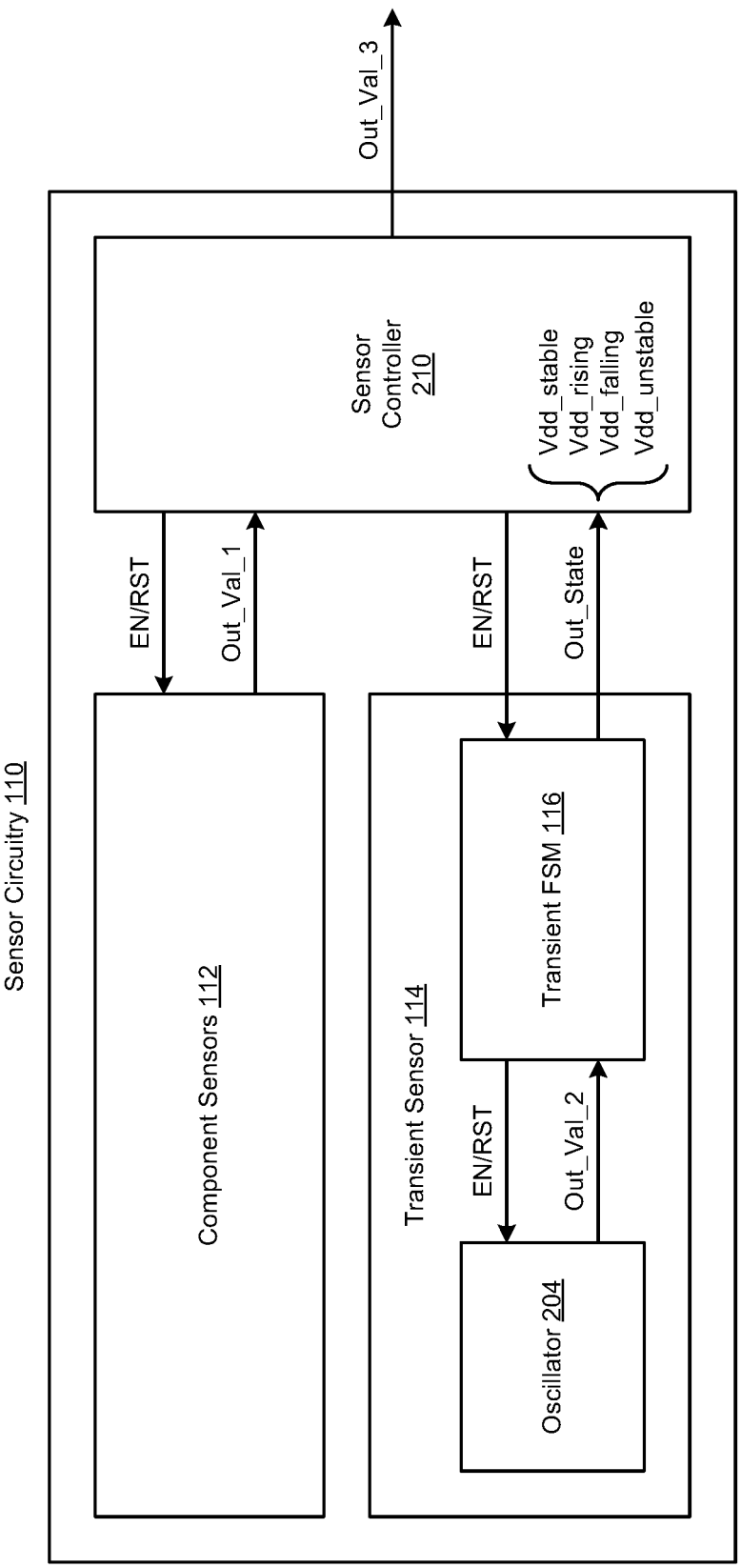
FIG. 2 illustrates a schematic diagram of sensor circuitry in accordance with various implementations described herein.

FIG. 2 illustrates a diagram 200 of the sensor circuitry 110 in accordance with implementations described herein. Similar components described in FIG. 2 generally have similar scope, operation and function in a manner as described in reference to FIG. 1.

As shown in FIG. 2, the sensor circuitry 110 includes the one or more component sensors 112, the transient sensor 114 and a sensor controller 210. As described herein, the one or more component sensors 112 may be implemented as a type of performance sensing circuitry having a logic structure for detecting performance variation of any one amongst the memory structure (i.e., bitcells in the array), logic NMOS devices, logic PMOS devices, parasitic resistance, parasitic capacitance, or any combination thereof. In some instances, the logic structure may provide an output signal to the voltage regulator circuitry 124 via the control circuitry 108 based on detected variation of performance of the memory structure. As shown, the component sensors 112 may receive an enable/reset signal (EN/RST) and provide a first output value (Out_Val_1) based on the enable/reset signal (EN/RST).

The transient sensor 112 may include the transient FSM 116 and an oscillator 204 that is adapted to provide an output oscillating frequency associated with detecting variation of performance of any one amongst the memory structure, logic NMOS devices, logic PMOS devices, parasitic resistance, parasitic capacitance, or any combination thereof. As described herein, the transient sensor 112 may be adapted to determine the stability of the output oscillating frequency, e.g., by measuring a waveform associated with the output oscillating frequency, identifying temporal behavior of the waveform, and using the transient FSM 116 to sense changes in the temporal behavior of the waveform. In some implementations, measuring the waveform may include sampling the waveform associated with the output oscillating frequency during a sampling period. The stability of the output oscillating frequency refers to a rising overshoot or falling undershoot of the output oscillating frequency during the sampling period. As described in greater detail in reference to FIG. 4, the transient sensor 114 may measure the waveform with one or more transient samples (TS) during the sampling period, and the sampling period may refer to a measurement window during which the transient sensor 114 measures the waveform associated with the output oscillating frequency. The transient sensor 114 may be adapted to provide a transient output state (Out_State) that identifies whether the temporal behavior of the waveform is stable, unstable, rising, falling, positive or negative.

In some instances, the oscillator 204 may operate as another type of performance sensing circuitry that is adapted to provide the output oscillating frequency associated with detecting performance variation of any one amongst the memory structure, logic NMOS devices, logic PMOS devices, parasitic resistance, parasitic capacitance, or any combination thereof. The oscillator 204 may receive an enable/reset signal (EN/RST) and also provide a second output value (Out_Val_2) based on the enable/reset signal (EN/RST). Also, the transient FSM 116 receives another enable/reset signal (EN/RST) and provides the output state signal (Out_State) based on the enable/reset signal (EN/RST) and based on the second output value (Out_Val_2). In various instances, the output state signal (Out_State) provides a coded control signal associated with a state of sensed stability of the output oscillating frequency, e.g., including at least one of a Vdd_stable state, a Vdd_unstable state, a Vdd_rising state and a Vdd_falling state.

The sensor controller 210 may be configured to provide the enable/reset signal (EN/RST) to the one or more component sensors 112 and also receive the first output value signal (Out_Val_1). In addition, the sensor controller 210 may be configured to provide the enable/reset signal (EN/RST) to the transient sensor 114 and also receive the output state signal (Out_State). The sensor controller 210 may also be configured to determine the state of stability of the output oscillating frequency, e.g., including at least one of a Vdd_stable state, a Vdd_unstable state, a Vdd_rising state and a Vdd_falling state.

In some implementations, during measurements, the component sensors 112 and the transient sensor 114 may operate in parallel. In some instances, a sampling period allows for determining when a new (or a next) measurement series starts, and the sample window may determine a temporal period to measure and an average of the measure. The transient sensor and one or more component sensors may be used, and this set of sensors operate together in parallel to perform measurements. The measurements may be performed with one set of component sensors at a time (e.g., serially). Before each measure, the selected component sensors may be cleared, and during each measure, the transient sensor 114 may be run in parallel with the selected component sensors 112. In some instances, the transient sensor 114 may operate as a slope voltage detector that provides data and information as to whether voltage is rising, stable, falling, too low, too high and/or inconsistent. As such, the transient sensor 114 may be activated in parallel during each measurement of the set of sensors so as to validate the measurements. At the end of the sampling period, if voltage was determined to be stable, then sensor measurements are relevant. Also, if voltage was determined to be unstable, then sensor measurements may be discarded, or if voltage was determined to be rising or falling, then sensor measurements may be continually monitored for changes.

Figure 3:
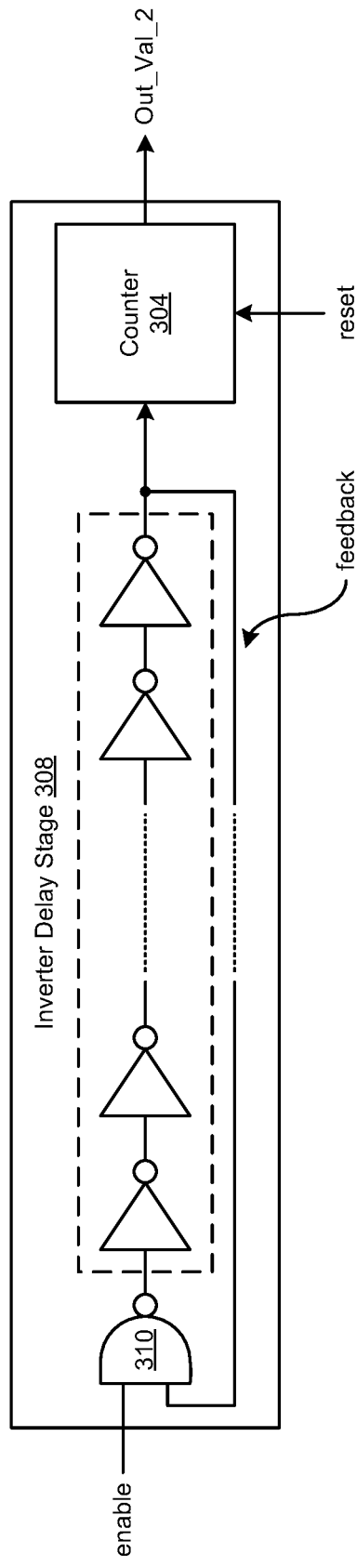
FIG. 3 illustrates a schematic diagram of oscillator circuitry in accordance with various implementations described herein.

FIG. 3 illustrates a schematic diagram 300 of the oscillator circuitry 204 of FIG. 2 in accordance with various implementations described herein. The oscillator circuitry 204 may be generally referred to as an oscillator.

As shown in FIG. 3, the oscillator 204 may include a ring oscillator that is adapted to operate as performance sensing circuitry for providing the output oscillating frequency associated with detecting variation of performance of a set of inverters. Thus, the ring oscillator 204 may include an inverter delay stage 308 that is adapted to provide the output oscillating frequency to a counter 304.

The oscillator 204 may include the counter 304 that is coupled to the inverter delay stage 308. In some instances, the counter 304 is adapted to receive the output oscillating frequency from the oscillator (or ring oscillator or inverter delay stage 308), count a number of pulses associated with the output oscillating frequency, and provide an output or output count (Out_Val_2) of the number of pulses. In reference to FIG. 2, the transient FSM 116 may be coupled to the counter 304, and as such, the transient FSM 116 may be adapted to receive the output count of the number of pulses from the counter 304 and determine the stability of the output oscillating frequency based on the output count. In this instance, the transient FSM 116 may use the output count to determine whether a current output count changes from a previous output count. As described herein, the transient FSM 116 may be adapted to determine stability of the output oscillating frequency based on sensing changes in the temporal behavior of the waveform, and the transient FSM 116 is adapted to change between states of the stability of the output oscillating frequency based on sensing changes in the temporal behavior of the waveform.

Also, as shown in FIG. 3, the oscillator circuitry 204 may be implemented as a ring oscillator having the inverter delay stage 308 interposed between an input logic gate 310 (e.g., an NAND gate) and the counter 304. In various instances, the inverter delay stage 308 may include any number of inverter stages that are coupled in series, with only one condition that the oscillator circuitry 204 provides an oscillating output signal. The inverter delay stage 308 provides the output oscillating signal to the counter 304, and also, the input logic gate 310 receives multiple input signals, e.g., including an enable input signal (enable) and the output oscillating signal as a feedback input signal. The counter 304 may receive the output oscillating signal from the inverter delay stage 304, receive a reset signal (reset) from an external source, and provide the output signal (Out_Val_2) based on the received signals. In various instances, the input logic gate 310 may be implemented with different types of logic gates, such as, e.g., AND/NAND gates, OR/NOR gates, etc. As such, the enable may be NAND or NOR based. In other instances, the inverter stages may be implemented with any other logic structure that provides an inverting output, such as, e.g., using NAND/NOR logic stages. Also, in still other instances, the oscillator may be any other type of voltage controlled oscillator.

Figure 4:
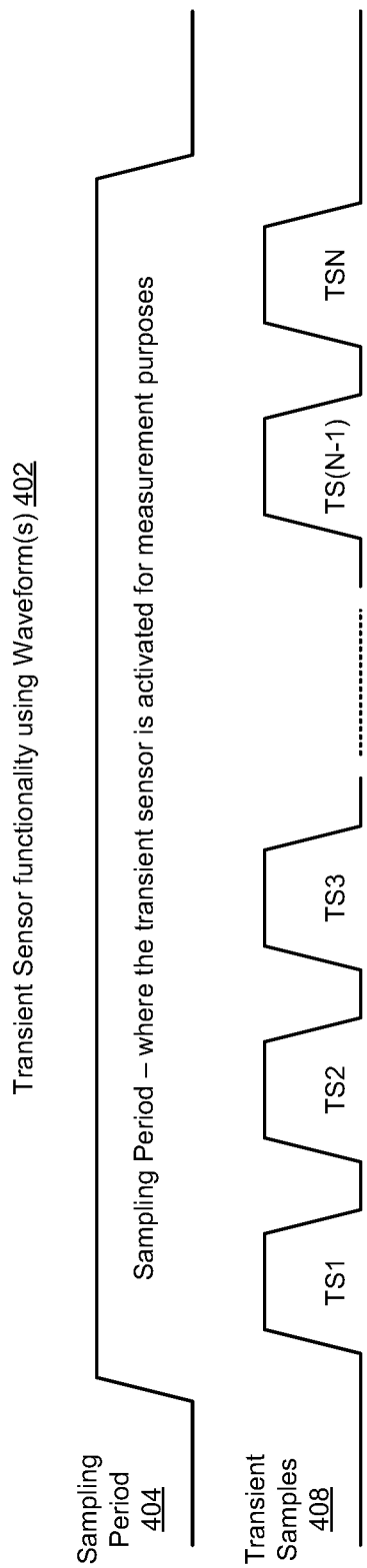
FIG. 4 illustrates a waveform diagram of transient samples in a sampling period used by the circuitry in accordance with implementations described herein.

FIG. 4 illustrates a waveform diagram 400 of various transient samples (TS) 408 in a sampling period 404 that may be used by the circuitry 100 in accordance with various implementations described herein. In reference to FIGS. 1-3, the transient sensor 116 may be adapted with functionality using waveforms 402, as descried herein below.

As described herein, the transient finite state machine (FSM) 116 may be adapted to determine the stability of the output oscillating frequency based on sensing changes in the temporal behavior of a waveform associated with the output oscillating frequency. In some instances, the transient FSM 116 may be adapted to change between states of the stability of the output oscillating frequency based on sensing changes in the temporal behavior of the waveform. Thus, the transient sensor 116 may measure the waveform associated with the output oscillating frequency by sampling the waveform with transient samples 408 (TS1, TS2, TS3, . . . , TS(N−1), TSN) during a sampling period 404. In some cases, the sampling period 404 refers to a temporal range of sampling time where the transient sensor 116 is activated for measurement purposes. The stability of the output oscillating frequency may refer to a rising overshoot or falling undershoot of the output oscillating frequency during the sampling period 404. As such, the transient sensor 114 may measure the waveform with one or more transient samples 408 (TS1, TS2, TS3, . . . , TS(N−1), TSN) during the sampling period 404, and the sampling period 404 may refer to a measurement window during which the transient sensor 114 measures the waveform associated with the output oscillating frequency.

In some implementations, the transient sensor 114 may operate and/or function as a controller having capability and/or functionality using a waveform. For instance, a controller may be adapted to communicate with the transient sensor 114 one or more times during a sampling period, and the controller may also be adapted to perform various computations based on different sample values from the transient sensor 114.

Figure 5A:
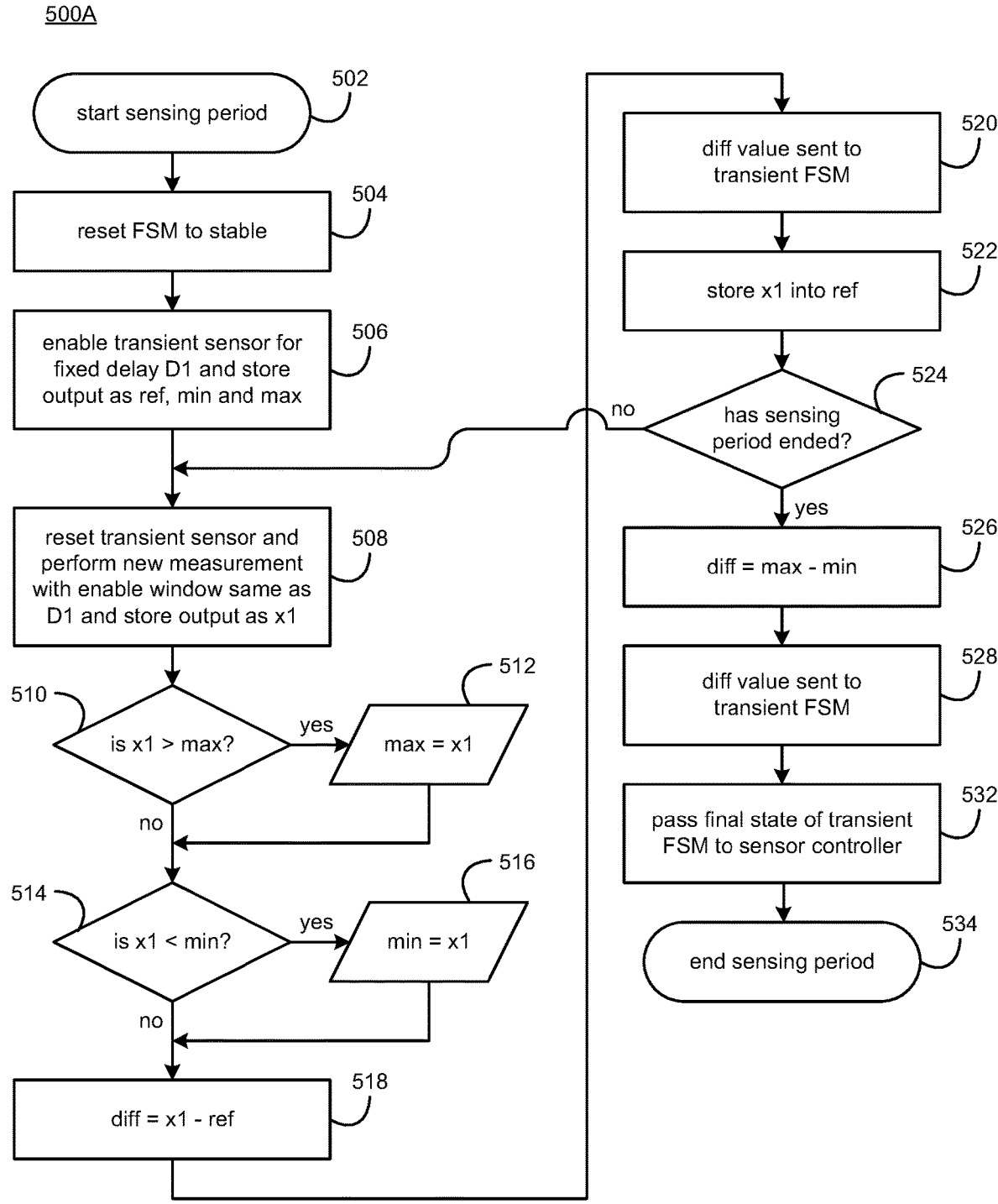
FIGS. 5A-5C illustrate process diagrams of various transient sensing methods in accordance with various implementations described herein.
Figure 5B:
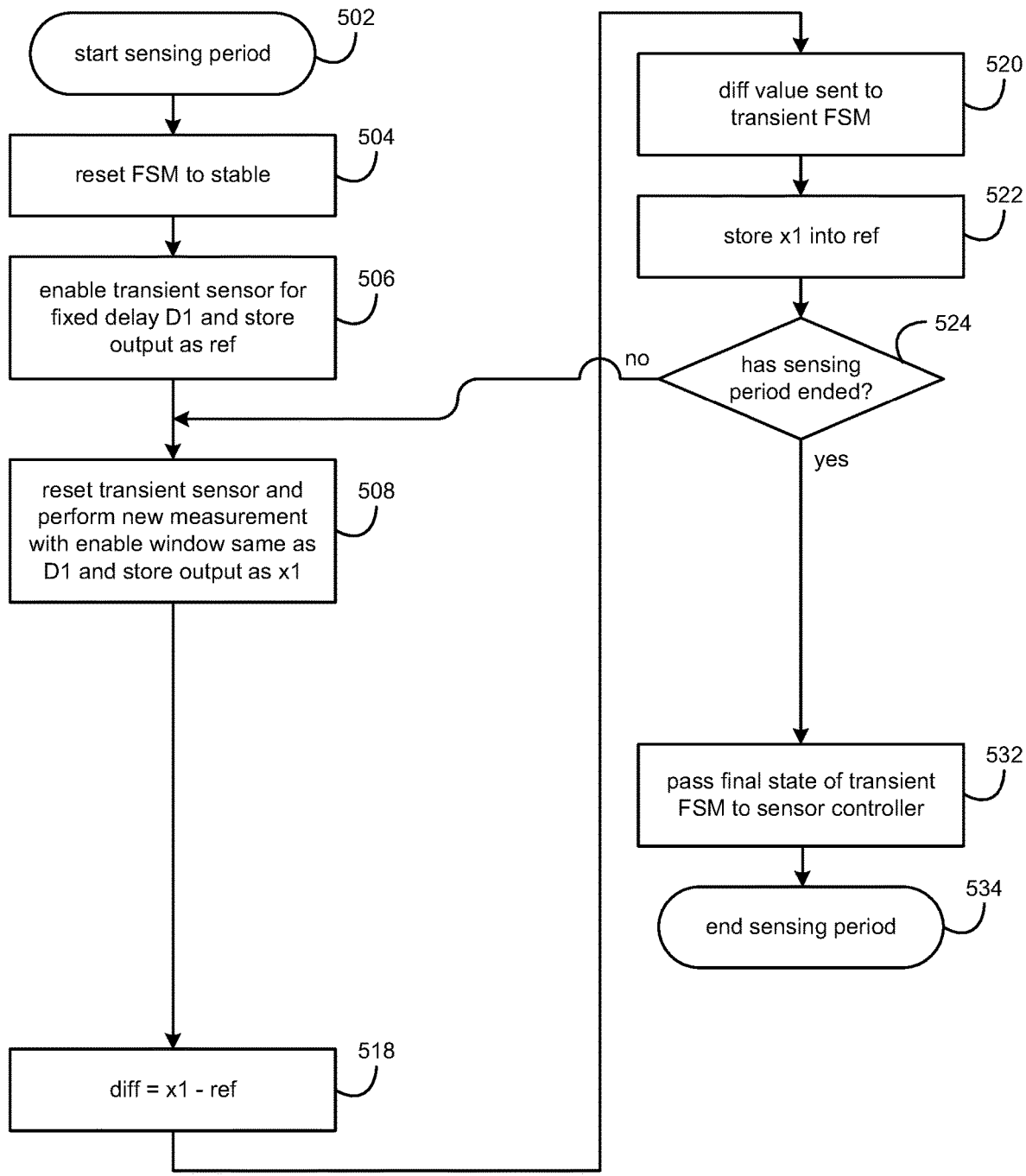
Figure 5C:
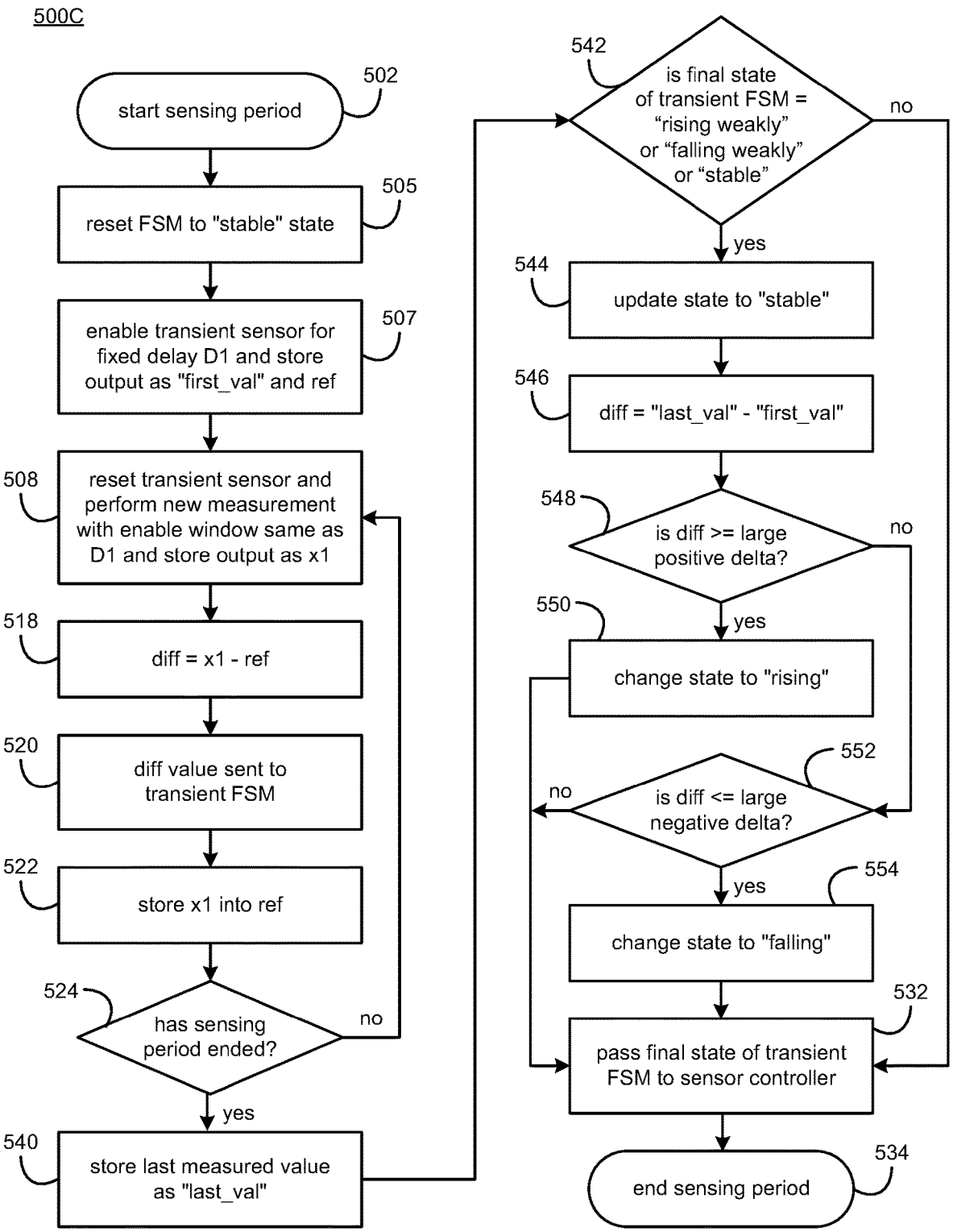

FIGS. 5A-5C illustrate process diagrams of various transient sensing methods in accordance with various implementations described herein. In particular, FIG. 5A shows a process flow diagram of a transient sensing method 500A, FIG. 5B shows a process flow diagram of another transient sensing method 500B, and FIG. 5C shows a process flow diagram of another transient sensing method 500C. In various implementations, the methods 500A, 500B, 500C may be performed by the sensor circuitry 110 along with assistance from various components thereof, such as, e.g., the transient sensor 114, the transient FSM 116 and/or the sensor controller 210 in reference to FIGS. 1-4.

It should be understood that even though methods 500A, 500B, 500C indicate a particular order of operation execution, in various instances, particular portions of operations may be executed in a different order, and on different systems. In other instances, various other additional operations and/or steps may be added to and/or omitted from methods 500A, 500B, 500C. Also, the methods 500A, 500B, 500C may be implemented in hardware and/or software. If implemented in hardware, the methods 500A, 500B, 500C may be implemented with various components and/or circuitry, as described herein in FIGS. 1-4. If implemented in software, methods 500A, 500B, 500C may also be implemented as a program or software instruction process configured for implementing the various transient sensing schemes and techniques, as described herein. Further, if implemented in software, instructions related to implementing methods 500A, 500B, 500C may be stored in memory and/or a database. For instance, a computer or various other types of computing devices having a processor and memory may be configured to perform methods 500A, 500B, 500C.

As described and shown in reference to FIG. 5A, method 500A may be used for implementing various transient schemes and techniques as described herein, which may be associated with improving performance by providing and/or utilizing the performance sensing circuitry and/or various associated devices, components and circuits described herein.

At starting block 502, method 500A may start a sensing period. At block 504, method 500A may reset the transient FSM to a stable state. At block 506, method 500A may enable the transient sensor for a fixed delay value D1 and assign (or store) the output as a reference value (ref), a minimum value (min), or a maximum value (max). At block 508, method 500A may reset the transient sensor and perform a new (or next) measurement with the enable window the same as the fixed delay value D1 and assign (or store) the output as an assignment value x1.

At decision block 510, method 500A may determine whether the assignment value x1 is greater than the maximum value (max). If yes, then at block 512, method 500A may assign (or store) the maximum value (max) equal to the assignment value x1 and proceed to proceed to decision block 514. If no, then method 500A may proceed to decision block 514.

At decision block 514, method 500A may determine whether the assignment value x1 is less than the minimum value (min). If yes, then at block 516, method 500A may assign the minimum value (min) equal to the assignment value x1 and proceed to decision block 518. If no, then method 500A may proceed to block 518.

At block 518, method 500A may assign a differential value (diff) equal to the assignment value x1 minus the reference value (ref). At block 520, method 500A may send (or pass or transmit) the differential value (diff) to the transient FSM116. At block 522, method 500A may assign (or store) the assignment value x1 into the reference value (ref).

At decision block 524, method 500A may determine whether the sensing period has ended. If yes, then method 500A proceeds to block 526. If no, then method 500A returns to block 508 so as to repeat one or more of the previous blocks.

At block 526, method 500A may assign (or store) the differential value (diff) equal to the maximum value (max) minus the minimum value (min). At block 528, method 500A may send (or pass or transmit) the differential value (diff) to the transient FSM 116.

At block 530, method 500A may assign (or store) a final output state as stable, rising, falling, or unstable. For instance, if the final output state is determined to be any one amongst "stable" 602, "falling weakly" 608 or "rising weakly" 604, then method 500A may assign (or store) the final state as "stable". In another instance, if the final output state is determined to be "rising weakly" 604 or "rising" 606, then method 500A may assign (or store) the "rising" state. Also, in another instance, if the final output state is determined to be "falling weakly" 608 or "falling" 610, then method 500A may assign (or store) "falling" state.

At block 532, method 500A may pass the final output state to the sensor controller 210. At ending block 534, method 500A may terminate the sensing period.

As described and shown in reference to FIG. 5B, method 500B may be used for implementing various transient schemes and techniques as described herein, which may be associated with improving performance by providing and/or utilizing the performance sensing circuitry and/or various associated devices, components and circuits described herein. Some blocks of method 500B are similar to blocks in method 500A of FIG. 5A.

At starting block 502, method 500B may start a sensing period. At block 504, method 500B may reset the transient FSM to the "stable" 602 state. At block 506, method 500B may enable the transient sensor for a fixed delay value D1 and assign (or store) the output as a reference value (ref). At block 508, method 500B may reset the transient sensor and perform a new (or next) measurement with the enable window the same as the fixed delay value D1 and assign (or store) the output as an assignment value x1.

At block 518, method 500B may assign a differential value (diff) equal to the assignment value x1 minus the reference value (ref). At block 520, method 500B may send (or pass or transmit) the differential value (diff) to the transient FSM 116. At block 522, method 500B may assign (or store) the assignment value x1 into the reference value (ref).

At decision block 524, method 500B may determine whether the sensing period has ended. If yes, then method 500B proceeds to block 530. If no, then method 500B returns to block 508 so as to repeat one or more of the previous blocks.

At block 530, method 500B may assign (or store) a final output state as stable, rising, falling, or unstable. For instance, if the final output state is determined to be any one amongst "stable" 602, "falling weakly" 608 or "rising weakly" 604, then method 500A may assign (or store) the final state as "stable". In another instance, if the final output state is determined to be "rising weakly" 604 or "rising" 606, then method 500A may assign (or store) the "rising" state. Also, in another instance, if the final output state is determined to be "falling weakly" 608 or "falling" 610, then method 500A may assign (or store) "falling" state.

At block 532, method 500B may pass the final output state to the sensor controller 210. At ending block 534, method 500B may terminate the sensing period.

As described and shown in reference to FIG. 5C, method 500C may be used for implementing various transient schemes and techniques as described herein, which may be associated with improving performance by providing and/or utilizing the performance sensing circuitry and/or various associated devices, components and circuits described herein. Some blocks of method 500C are similar to blocks in methods 500A, 500B of FIG. 5A-5B, with the exception of some altered or modified blocks along with some additional blocks.

At starting block 502, method 500C may start a sensing period. At block 505, method 500C may reset the transient FSM to a stable state. At block 507, method 500C may enable the transient sensor for a fixed delay value D1 and assign (or store) the output as a first value (first_val) and a reference value (ref). At block 508, method 500C may reset the transient sensor and perform a new (or next) measurement with the enable window the same as the fixed delay value D1 and assign (or store) the output as an assignment value x1.

At block 518, method 500C may assign a differential value (diff) equal to the assignment value x1 minus the reference value (ref). At block 520, method 500C may send (or pass or transmit) the differential value (diff) to the transient FSM 116. At block 522, method 500C may assign (or store) the assignment value x1 into the reference value (ref).

At decision block 524, method 500C may determine whether the sensing period has ended. If yes, then method 500C proceeds to block 540. If no, then method 500C returns to block 508 so as to repeat one or more of the previous blocks.

At block 540, method 500C may assign (or store) a last measured value as a last value (last_val). At decision block 542, method 500C may determine whether a final state is equal to a rising weakly state, a falling weakly state or a stable state. If yes, then method 500C proceeds to block 544. If no, then method 500C proceeds to block 532.

At block 544, method 500C may update the state to stable. At block 546, method 500C may assign (or store) a differential value (diff) as equal to the last value (last_val) minus the first value (first_val).

At decision block 548, method 500C may determine whether the differential value (diff) is greater than or equal to a large positive delta. If yes, then method 500C may proceed to block 550. If no, then method 500C may proceed to decision block 552.

At block 550, method 500C may change the state to rising (or increasing). At decision block 552, method 500C may determine whether the differential value (diff) is less than or equal to a large negative delta. If yes, then method 500C may proceed to block 554. If no, then method 500C may proceed to block 532. At block 554, method 500C may change the state to falling (or decreasing).

At block 532, method 500C may pass (or send or transmit) the final state to the sensor controller, which may be referred to as the transient FSM controller. At ending block 534, method 500C may terminate the sensing period.

Figure 6:
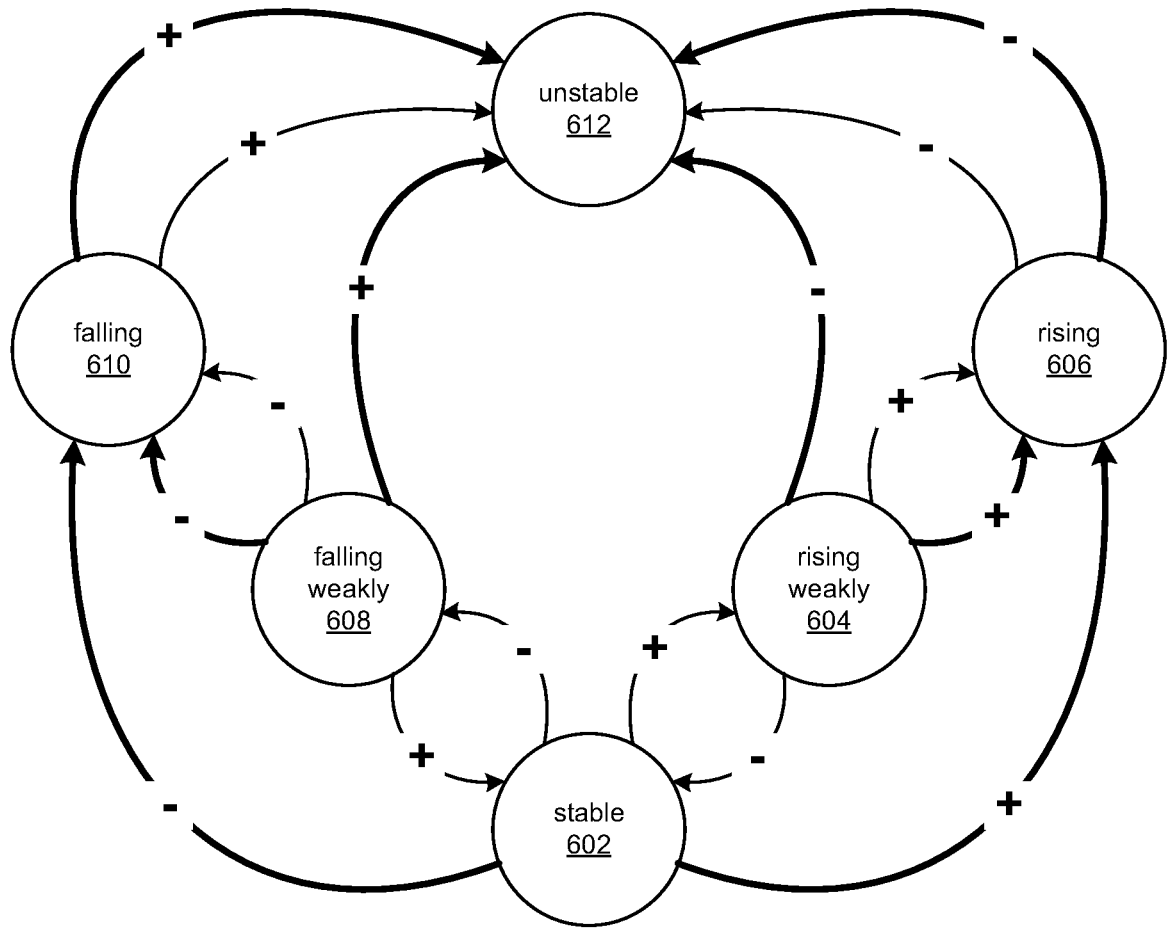
FIG. 6 illustrates a state diagram of a transient finite state machine (FSM) having various stability states in accordance with implementations described herein.

FIG. 6 illustrates a diagram 600 of the transient finite state machine (FSM) 116 having various stability states in accordance with implementations described herein.

As described herein, the stability of the output oscillating frequency may refer to a rising overshoot or falling undershoot of the output oscillating frequency during the sampling period. For instance, the transient sensor 116 may be adapted to provide a transient output that identifies whether the temporal behavior of the waveform is stable 602, unstable 612, increasing in a positive or upward direction (e.g., rising weakly 604 or rising 606), or decreasing in a negative or downward direction (e.g., falling weakly 608 or falling 610). Also, in some instances, the transient sensor 116 may be adapted to sense changes in the temporal behavior of the waveform based on the output count of the number of pulses from the counter 304. In this instance, the transient FSM 116 may be adapted to change between multiple states 602, 604, 606, 608, 610, 612 of the stability of the output oscillating frequency based on sensing changes in the temporal behavior of the waveform.

As such, in some instances, sensing changes refers to sensing a level of change including a weak level of change and a strong level of change, and the transient FSM 116 may move states of stability from one state to another different state based on sensing the level of change. In other instances, sensing changes may also refer to sensing a direction of change including an increasing direction of change and a decreasing direction of change, and the transient FSM 116 may move states of stability from one state to another different state based on sensing the direction of change. As described herein, the transient FSM 116 is adapted to provide one or more output states (e.g., stable, unstable, rising, and/or falling) of the output oscillating frequency to the sensor control circuitry 210 (i.e., sensor controller) based on sensing changes in the temporal behavior of the waveform.

As shown in FIG. 6, the transient FSM 116 may initiate (or start) in a stable state 602, wherein the output oscillating frequency is determined or identified to be stable. From the stable state 602, during a measurement of the waveform, the state of stability may remain in the stable state 602 or move to another different state of stability 604, 606, 608, 610. For instance, from the stable state 602, the state of stability may change and move to a rising state 604, 606. With a small positive delta (or change), the state of stability may change and move to a weakly rising state 604. With a large positive delta (or change), the state of stability may change and move to a rising state 606. In other instances, from the stable state 602, the state of stability may change and move to a falling state 608, 610. With a small negative delta (or change), the state of stability may change and move to a falling weakly state 608. With a large negative delta (or change), the state of stability may change and move to a falling state 610. Also, from one or more of the rising or falling states 604, 606, 608, 610, the state of stability may change and move to an unstable state 612. In some instances, the state of stability may change and move from the rising state 606 and the falling state 610 to the rising weakly state 604 and the falling weakly state 608, respectively. Also, in other instances, the state of stability may change and move from the rising weakly state 604 and the falling weakly state 608 to the stable state 602, respectively.

Further, as described herein, the transient FSM 116 may be adapted to determine whether a current stability state changes from a previous stability state, wherein the change in state may refer to a change in the output count from the counter 304. As such, the transient FSM 116 may use the output count received from the counter 304 to determine whether a current output count changes from a previous output count. For instance, the transient FSM 116 may determine a differential value (diff value) between a current output count changes from a previous output count. Thus, as shown in FIG. 6, a first state change 620 may refer to a differential value (diff value) between a small positive delta and a large positive delta. In another instance, a second state change 622 may refer to a differential value (diff value) that is greater than or equal to a large positive delta. In another instance, a third state change 624 may refer to a differential value (diff value) between a large negative delta and a small negative delta. In still another instance, a fourth state change 626 may refer to a differential value (diff value) that is less than or equal to a large negative delta.

Figure 7:
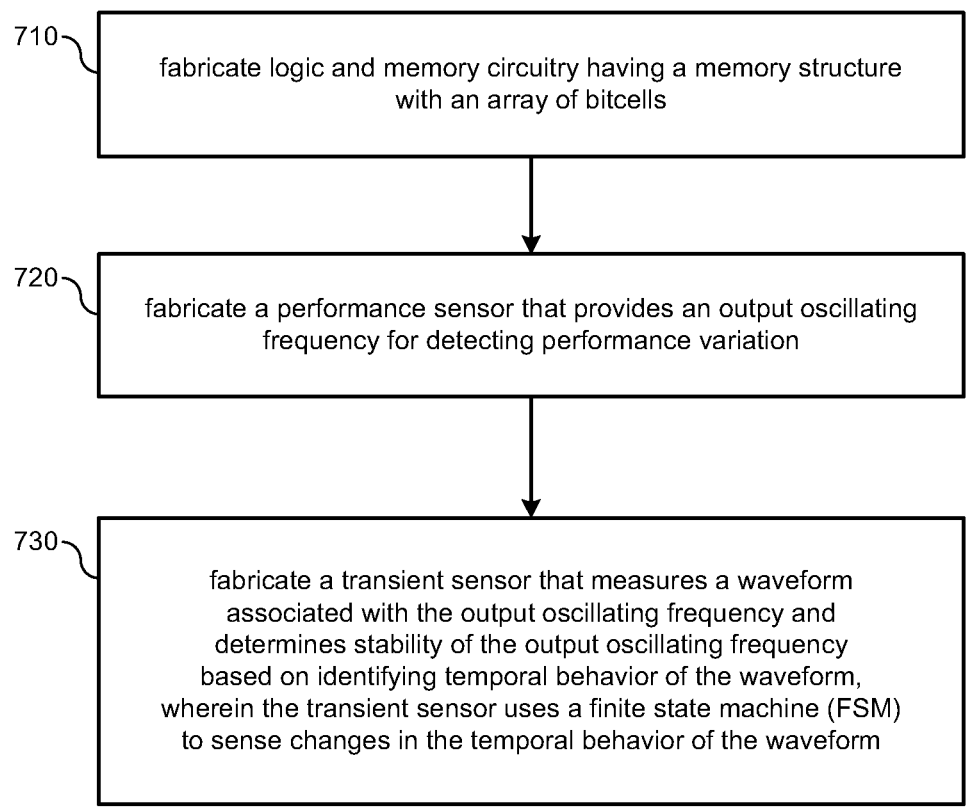
FIG. 7 illustrates a process diagram of a method for providing transient sensing circuitry in accordance with various implementations described herein.

FIG. 7 illustrates a process flow diagram of a method 700 for providing transient sensing circuitry in accordance with implementations described herein.

It should be understood that even though method 700 indicates a particular order of operation execution, in some cases, various certain portions of the operations may be executed in a different order, and on different systems. In other cases, additional operations and/or steps may be added to and/or omitted from method 700. Also, method 700 may be implemented in hardware and/or software. If implemented in hardware, the method 700 may be implemented with various components and/or circuitry, as described herein in reference to FIGS. 1-6. Also, if implemented in software, method 700 may be implemented as a program and/or software instruction process configured for providing performance sensing circuitry, as described herein above. Further, if implemented in software, instructions related to implementing the method 700 may be stored in memory and/or a database. For instance, a computer or various other types of computing devices having at least one processor and memory may be configured to perform method 700.

As described and shown in reference to FIG. 7, method 700 may be utilized for fabricating and/or manufacturing, or causing to be fabricated and/or manufactured, an integrated circuit (IC) that implements various memory performance managing schemes and techniques as described herein that are related to providing performance sensing circuitry and/or various associated devices, components and circuits.

At block 710, method 700 may fabricate logic and memory circuitry, with memory circuitry having a memory structure with an array of bitcells. At block 720, method 700 may fabricate a performance sensor that provides an output oscillating frequency for detecting performance variation of the memory structure. At block 730, method 700 may fabricate a transient sensor that measures a waveform associated with the output oscillating frequency and determines stability of the output oscillating frequency based on identifying temporal behavior of the waveform, wherein the transient sensor uses a finite state machine (FSM) to sense changes in the temporal behavior of the waveform.

Described herein are various implementations of an integrated circuit. The integrated circuit may include logic circuitry having one or more components. The integrated circuit may include performance sensing circuitry that provides a performance sensing output associated with detecting variation of switching delays of the one or more components forming the logic circuitry. The integrated circuit may include transient sensing circuitry that receives the performance sensing output and provides a transient sensing output for determining stability of operating conditions of the performance sensing circuitry during one or more sampling periods. The transient sensing circuitry may use a finite state machine (FSM) to sense and classify changes in temporal behavior of the transient sensing output.

In some implementations, the logic circuitry may include memory circuitry having a memory structure with an array of bitcells, and the performance sensing circuitry may be adapted to provide the performance sensing output associated with detecting variation of performance of the memory structure. The FSM may sample the transient sensing output with one or more transient samples during the one or more sampling periods, and the one or more sampling periods may refer to one or more measurement windows during which the performance sensing circuitry is acquiring data for a subset of the one or more components of the logic circuitry. The performance sensing circuitry may provide the performance sensing output during a stable voltage and temperature condition within the one or more sampling periods. The transient sensing circuitry may measure the stability of voltage and temperature with one or more transient samples during the one or more sampling periods, and the one or more sampling periods refer to one or more measurement windows during which the performance sensing circuitry is acquiring data for a subset of the one or more components of the logic circuitry.

In some implementations, the FSM may be adapted to identify whether the temporal behavior during the one or more sampling periods is stable, unstable, rising or falling. The integrated circuit may include control circuitry that receives output of the performance sensing circuitry with an associated FSM state at an end of the one or more sampling periods, and the associated FSM state represents the output from the transient sensing circuitry and implements an adaptive voltage scaling (AVS) algorithm to thereby adaptively adjust voltage provided to the logic circuitry. The transient sensing circuitry may include a ring oscillator that provides an oscillating output that varies with operating conditions of voltage and temperature. The transient sensing circuitry may have a counter coupled to the ring oscillator, and the counter receives the oscillating output from the ring oscillator, counts a number of pulses during the sample window of the transient sensing circuitry, and provides an output count of the number of pulses.

In some implementations, the FSM may be coupled to the transient sensing circuitry, and the FSM may use the transient sensing output to classify changes between successive transient sensing outputs. The FSM may use the transient sensing output to sense a level of change including a weak level of change and a strong level of change, and the FSM may move a state of stability from one state to another different state based on the sensed level of change. The FSM may use the transient sensing output to determine a direction of change including an increasing direction of change and a decreasing direction of change, and the FSM may move a state of stability from one state to another different state based on sensing the direction of change and a magnitude related to the direction of change. The FSM may provide an output classification for the transient sensing circuitry based on sensing the changes in the temporal behavior related to operating conditions of the transient sensing circuitry.

Described herein are various implementations of a transient sensing circuit. The transient sensing circuit may include a transient sensor adapted to provide digital outputs related to detecting variation of voltage and temperature affecting logic circuitry and memory circuitry. The transient sensing circuit may include a finite state machine (FSM) adapted to receive the digital outputs and classify stability of the voltage and the temperature based on the digital outputs, and the FSM may be set to a stable state at a start of one or more sampling period and uses changes between successive digital outputs to determine magnitude and direction of changes from previous digital outputs.

In some implementations, the transient sensor may include an oscillator and a counter adapted to receive an output signal from the oscillator, count a number of pulses associated with an output oscillating frequency of the output signal, and provide an output count of the number of pulses. The FSM receives the output count and classify stability of the digital outputs based on changes from a previous output count. The oscillator may include a ring oscillator having an inverting delay stage interposed between an input logic gate and the counter, and the inverting delay stage provides an output oscillating signal to the counter, and the input logic gate receives multiple input signals including an enable input signal and the output oscillating signal as a feedback input signal.

In some implementations, the FSM may be adapted to determine stability of the digital output based on sensing changes in temporal behavior of operating conditions associated with the logic circuitry and the memory circuitry, and the FSM may be adapted to change between states of stability based on changes from a previous digital output. In some instances, sensing the changes refers to sensing a level of change including a weak level of change and a strong level of change, and the FSM moves the states of stability from one state to another different state based on sensing the level of change. In some instances, sensing the changes may refer to sensing a direction of change including an increasing direction of change and a decreasing direction of change, and the FSM may move the states of stability from one state to another different state based on sensing the direction of change.

Described herein are various implementations of a method. The method may include fabricating logic and memory having a memory structure with an array of bitcells. The method may include fabricating a performance sensor that provides an output for detecting performance variation of the logic and the memory structure. The method may include fabricating a transient sensor that validates the output from the performance sensor and determines stability of operating voltage and temperatures based on identifying temporal behavior that affects the performance sensor. The transient sensor may use a finite state machine (FSM) to sense changes in the temporal behavior of the output from the performance sensor.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   logic circuitry having one or more components;
   performance sensing circuitry that provides a performance sensing output associated with detecting variation of switching delays of the one or more components forming the logic circuitry; and
   transient sensing circuitry that receives the performance sensing output and provides a transient sensing output for determining stability of operating conditions of the performance sensing circuitry during one or more sampling periods,
   wherein the transient sensing circuitry uses a finite state machine (FSM) to sense and classify changes in temporal behavior of the transient sensing output.

2. The integrated circuit of claim 1, wherein the logic circuitry comprises memory circuitry having a memory structure with an array of bitcells, and wherein the performance sensing circuitry is adapted to provide the performance sensing output associated with detecting variation of performance of the memory structure.

3. The integrated circuit of claim 1, wherein the FSM samples the transient sensing output with one or more transient samples during the one or more sampling periods, and wherein the one or more sampling periods refer to one or more measurement windows during which the performance sensing circuitry is acquiring data for a subset of the one or more components of the logic circuitry.

4. The integrated circuit of claim 1, wherein the performance sensing circuitry provides the performance sensing output during a stable voltage and temperature condition within the one or more sampling periods.

5. The integrated circuit of claim 1, wherein the transient sensing circuitry measures the stability of voltage and temperature with one or more transient samples during the one or more sampling periods, and wherein the one or more sampling periods refer to one or more measurement windows during which the performance sensing circuitry is acquiring data for a subset of the one or more components of the logic circuitry.

6. The integrated circuit of claim 5, wherein the FSM is adapted to identify whether a temporal behavior during the one or more sampling periods is stable, unstable, rising or falling.

7. The integrated circuit of claim 5, further comprising:
control circuitry that receives output of the performance sensing circuitry with an associated FSM state at an end of the one or more sampling periods,
wherein the associated FSM state represents the output from the transient sensing circuitry and implements an adaptive voltage scaling (AVS) algorithm to adaptively adjust voltage provided to the logic circuitry.

8. The integrated circuit of claim 1, wherein the transient sensing circuitry has a ring oscillator that provides an oscillating output that varies with operating conditions of voltage and temperature.

9. The integrated circuit of claim 8, wherein the transient sensing circuitry has a counter coupled to the ring oscillator, wherein the counter receives the oscillating output from the ring oscillator, counts a number of pulses during the sampling periods of the transient sensing circuitry, and provides an output count of the number of pulses.

10. The integrated circuit of claim 1, wherein the FSM is coupled to the transient sensing circuitry, and wherein the FSM uses the transient sensing output to classify changes between successive transient sensing outputs.

11. The integrated circuit of claim 1, wherein the FSM uses the transient sensing output to sense a level of change including a weak level of change and a strong level of change, and wherein the FSM moves a state of stability from one state to another different state based on the sensed level of change.

12. The integrated circuit of claim 1, wherein the FSM uses the transient sensing output to determine a direction of change including an increasing direction of change and a decreasing direction of change, and wherein the FSM moves a state of stability from one state to another different state based on sensing the direction of change and a magnitude related to the direction of change.

13. The integrated circuit of claim 1, wherein the FSM provides an output classification for the transient sensing circuitry based on sensing the changes in a temporal behavior related to operating conditions of the transient sensing circuitry.

14. A transient sensing circuit, comprising:
a transient sensor adapted to provide digital outputs related to detecting variation of voltage and temperature affecting logic circuitry and memory circuitry; and
a finite state machine (FSM) adapted to receive the digital outputs and classify stability of the voltage and the temperature based on the digital outputs,
wherein the FSM is set to a stable state at a start of one or more sampling periods and uses changes between successive digital outputs to determine magnitude and direction of changes from previous digital outputs.

15. The transient sensing circuit of claim 14, wherein the transient sensor comprises:
an oscillator; and
a counter adapted to receive an output signal from the oscillator, count a number of pulses associated with an output oscillating frequency of the output signal, and provide an output count of the number of pulses,
wherein the FSM receives the output count and classifies stability of the digital outputs based on changes from a previous output count.

16. The transient sensing circuit of claim 15, wherein the oscillator comprises a ring oscillator having an inverting delay stage interposed between an input logic gate and the counter, wherein the inverting delay stage provides an output oscillating signal to the counter, and wherein the input logic gate receives multiple input signals including an enable input signal and the output oscillating signal as a feedback input signal.

17. The transient sensing circuit of claim 14, wherein the FSM is adapted to determine stability of the digital output based on sensing changes in temporal behavior of operating conditions associated with the logic circuitry and the memory circuitry, and wherein the FSM is adapted to change between states of stability based on changes from a previous digital output.

18. The transient sensing circuit of claim 17, wherein sensing the changes refers to sensing a level of change including a weak level of change and a strong level of change, and wherein the FSM moves the states of stability from one state to another different state based on sensing the level of change.

19. The transient sensing circuit of claim 17, wherein sensing the changes refers to sensing a direction of change including an increasing direction of change and a decreasing direction of change, and wherein the FSM moves the states of stability from one state to another different state based on sensing the direction of change.

20. A method, comprising:
fabricating logic and memory having a memory structure with an array of bitcells;
fabricating a performance sensor that provides an output for detecting performance variation of the logic and the memory structure; and
fabricating a transient sensor that validates the output from the performance sensor and determines stability of operating voltage and temperatures based on identifying temporal behavior that affects the performance sensor,
wherein the transient sensor uses a finite state machine (FSM) to sense changes in the temporal behavior of the output from the performance sensor.

* * * * *